(12) United States Patent
Chaki

(10) Patent No.: US 6,982,603 B2
(45) Date of Patent: Jan. 3, 2006

(54) RADIO-FREQUENCY POWER AMPLIFICATION CIRCUIT HAVING STABILIZATION CIRCUIT

(75) Inventor: Shin Chaki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 531 days.

(21) Appl. No.: 10/338,676

(22) Filed: Jan. 9, 2003

(65) Prior Publication Data
US 2004/0029535 A1    Feb. 12, 2004

(30) Foreign Application Priority Data
Aug. 8, 2002   (JP) .............................. 2002-231948

(51) Int. Cl.
*H03F 3/04*   (2006.01)
(52) U.S. Cl. ........................ 330/302; 330/306; 330/286
(58) Field of Classification Search ................ 330/302, 330/306, 286, 53
See application file for complete search history.

(56) References Cited

U.S. PATENT DOCUMENTS

| | | | | |
|---|---|---|---|---|
| 4,525,678 A | * | 6/1985 | Lehmann et al. | 330/277 |
| 4,930,044 A | * | 5/1990 | Eda et al. | 361/313 |
| 5,159,287 A | * | 10/1992 | Furutani et al. | 330/286 |
| 6,130,580 A | * | 10/2000 | Uchida et al. | 330/286 |
| 6,225,756 B1 | * | 5/2001 | Gitsevich | 315/248 |

\* cited by examiner

*Primary Examiner*—Patricia Nguyen
(74) *Attorney, Agent, or Firm*—Leydig, Voit & Mayer, Ltd.

(57) ABSTRACT

A radio-frequency power amplification circuit includes a transistor and a stablization circuit that is provided upstream of the transistor. The stabilization circuit includes a series resistor, a first end of which is connected to the transistor and a second end of which is connected to an input terminal, a resistance element, a first end of which is connected to the second end of the series resistor, and a short stub, a first end of which is connected to the second end of the resistance element and the second end of which is grounded via a capacitance element.

3 Claims, 3 Drawing Sheets

RADIO-FREQUENCY POWER AMPLIFICATION CIRCUIT HAVING STABILIZATION CIRCUIT

BACKGROUND OF THE INVENTION

1. Field of the Invention

The present invention relates to a radio-frequency power amplification circuit and, more particularly, to stabilization circuit for stabilizing a gain of a radio-frequency power amplification circuit.

2. Description of the Background Art

In designing a radio-frequency power amplification circuit (hereinafter abbreviated as "amplification circuit") that is used in a microwave band, a submillimeter wave band, or a millimeter wave band or an MMIC (monolithic microwave integrated circuit), an optimum type of active element, gate width thereof, bias conditions, etc. are selected in accordance with a required frequency, gain, output power, etc.

To attain high performance and low cost of the entire microwave/millimeter wave system (entire chip set) including an oscillator, a mixer, and a frequency multiplier, a type of active element, its gate width, bias conditions, etc. may not necessarily be set so as to be most suitable for an amplification circuit.

For example, in designing an intermediate-frequency amplification circuit to be used in a millimeter wave system, there may occur a case that it is necessary to use an active element that can operate in an unnecessarily high frequency range. This is to give priority to conditions that are most suitable for other devices because this amplification circuit is not a device that directly affects the performance of the millimeter wave system. In this case, it is necessary for a stabilization circuit to attain stabilization in a wide frequency range covering ranges above and below a design frequency band (hereinafter abbreviated as "design band").

FIG. 4 is a circuit diagram of a conventional radio-frequency power amplification circuit.

In FIG. 4, reference numeral 10 denotes a field-effect transistor (hereinafter abbreviated as "transistor") used as an active element and numeral 40 denotes a stabilization circuit that is provided upstream of the transistor 10. The stabilization circuit 40 includes a resistance element 42, one end of which is connected to a gate terminal of the transistor 10 and an input terminal 1, a short stub 43, one end of which is connected to the other end of the resistance element 42, and a capacitance element 44, one end of which is connected to the other end of the short stub 43, and the other end of which is grounded.

A drain terminal of the transistor 10 is connected to an output terminal and its source terminal is grounded.

FIG. 5 is a graph showing frequency characteristics of the gain (MAG, MSG) of the conventional radio-frequency power amplification circuit of FIG. 4.

In FIG. 5, a broken line A indicates a frequency characteristic of the gain (MAG, MSG) of the active element 10 itself and a solid line C indicates a frequency characteristic of the gain (MAG, MSG) of the combination of the active element 10 and the stabilization circuit 40. In FIG. 5, the horizontal axis which represents the frequency has a logarithmic scale.

In the case of the active element 10 itself, as indicated by the broken line A, the gain of the amplification circuit is not stable in a wide frequency range covering ranges above and below a design band; an MSG range (i.e., an unstable range where the stabilization coefficient k<1) is formed there.

On the other hand, where the stabilization circuit 40 is added to the active element 10, the gain of the amplification circuit is stable in a wide frequency range covering ranges above and below the design band as indicated by the solid line C.

However, there remains a problem that when it is intended to stabilize the gain in a frequency range higher than the design band by using the conventional stabilization circuit 40, the gain of the amplification circuit is much lower in the design band as indicated by an arrow in FIG. 5.

SUMMARY OF THE INVENTION

The present invention has been conceived to solve the previously-mentioned problems and a general object of the present invention is to provide a novel and useful radio-frequency power amplification circuit.

A more specific object of the present invention is to provide a radio-frequency power amplification circuit that satisfies both of gain stabilization in a frequency range covering ranges above and below a design band and a high gain in the design band.

The above object of the present invention is attained by a following radio-frequency power amplification circuit.

According to one aspect of the present invention, the radio-frequency power amplification circuit comprises an active element and a stabilization circuit provided upstream of the active element. The stabilization circuit has a first resistance element, a second resistance element and a short stub. One end of the first resistance element is connected to the active element, and the other end of the first resistance element is connected to an input terminal. One end of the second resistance element is connected to the other end of the first resistance element. One end of the short stub is connected to the other end of the second resistance element, and the other end of the short stub is grounded.

Other objects and further features of the present invention will be apparent from the following detailed description when read in conjunction with the accompanying drawings.

DETAILED DESCRIPTION OF THE PREFERRED EMBODIMENTS

Figure 1:
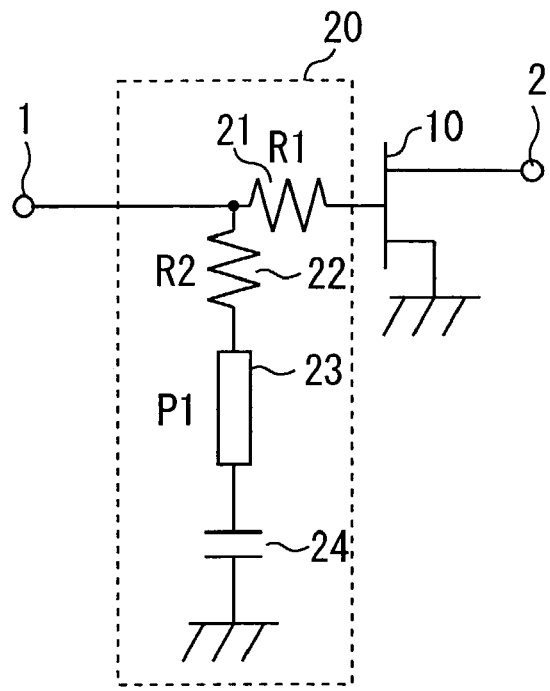
FIG. 1 is a circuit diagram of a radio-frequency power amplification circuit according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

FIG. 1 is a circuit diagram of a radio-frequency power amplification circuit according to a first embodiment of the present invention.

In FIG. 1, reference numeral 1 denotes an input terminal (external input terminal); 2 denotes an output terminal (external output terminal); 10 denotes a field-effect transistor (FET; hereinafter abbreviated as "transistor") as an exemplary active element; 20 denotes a stabilization circuit; 21 denotes a series resistor (R1) as a first resistance element; 22 denotes a resistance element (R2) as a second resistance element; 23 denotes a short stub (P1); and 24 denotes a capacitance element.

As shown in FIG. 1, the stabilization circuit 20 is provided immediately upstream of the transistor 10. In other words, the stabilization circuit 20 is provided between the input terminal 1 and the transistor 10.

The stabilization circuit 20 is equipped with the series resistor (R1) 21 one end of which is connected to a gate terminal of the transistor 10, the resistance element (R2) 22 one end of which is connected to the other end of the series resistor 21 and the input terminal 1, the short stub 23 one end of which is connected to the other end of the resistance element 22, and the capacitance element 24 for DC component separation one end of which is connected to the other end of the short stub 23 and the other end of which is grounded.

That is, the stabilization circuit 20 has a circuit configuration that the series resistor (R1) 21 is combined with the short stub 23 having the resistance element (R2) 22. The other end (short end) of the short stub 23 is grounded via the capacitance element 24.

The source terminal of the transistor 10 is grounded and its drain terminal is connected to the output terminal 2.

Figure 2:
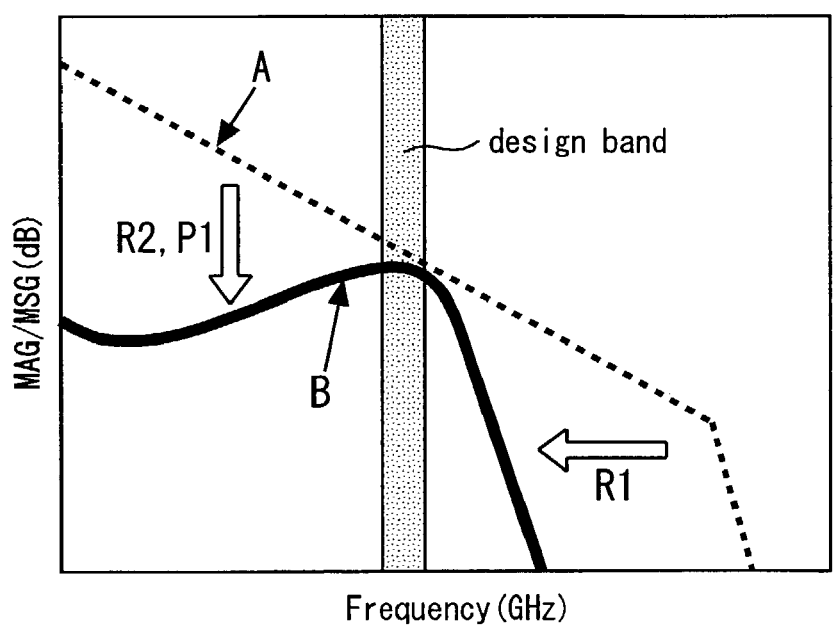
FIG. 2 is a graph showing frequency characteristics of the gain (MAG, MSG) of the radio-frequency power amplification circuit of FIG. 1.

FIG. 2 is a graph showing frequency characteristics of the gain (MAG, MSG) of the radio-frequency power amplification circuit of FIG. 1.

In FIG. 2, a broken line A indicates a frequency characteristic of the gain (MAG, MSG) of the active element 10 itself and a solid line B indicates a frequency characteristic of the gain (MAG, MSG) of the combination of the active element 10 and the stabilization circuit 20. In FIG. 2, a horizontal axis which represents the frequency has a logarithmic scale.

In the case of the active element 10 itself, as indicated by the broken line A, the gain of the amplification circuit is not stable in a wide frequency range covering ranges above and below a design band; an MSG range (i.e., an unstable range where the stabilization coefficient k<1) is formed there.

On the other hand, where the stabilization circuit 20 is added to the active element 10, as indicated by the solid line B, the gain is stabilized in a frequency range higher than the design band by the series resistor (R1) 21 and the gain is stabilized in a frequency range lower than the design band by the short stub 23 having the resistance element (R2) 22 (i.e., the resistance element 22 and the short stub 23).

A pronounced gain suppressing effect is obtained in the frequency range higher than the design band.

Further, the degree of gain reduction in the design band can be made much lower than in the conventional amplification circuit.

As described above, according to the first embodiment, the stabilization circuit 20 in which the series resistor 21 is combined with the short stub 23 having the resistance element 22 is provided upstream of the active element 10 of the radio-frequency power amplification circuit.

According to the first embodiment, the series resistor 21 can stabilize the gain in a frequency range higher than the design band and the resistance element 22 and the short stub 23 can stabilize the gain in a frequency range lower than the design band. Therefore, it is possible to stabilize the gain of the amplification circuit in the frequency range covering the ranges above and below the design band. Further, according to the first embodiment, the degree of gain reduction in the design band can be made much lower than in the conventional amplification circuit; a high gain can be obtained in the design band.

Therefore, the first embodiment can provide a radio-frequency power amplification circuit that satisfies both of gain stabilization in a frequency range covering ranges above and below a design band and a high gain in the design band.

Although in the first embodiment the field-effect transistor is used as an example of the active element 10, a high electron mobility transistor (HEMT) or a heterojunction bipolar transistor (HBT) may be used.

Although in the first embodiment the short stub 23 is grounded via the capacitance element 24, it may be grounded directly.

Second Embodiment

Figure 3:
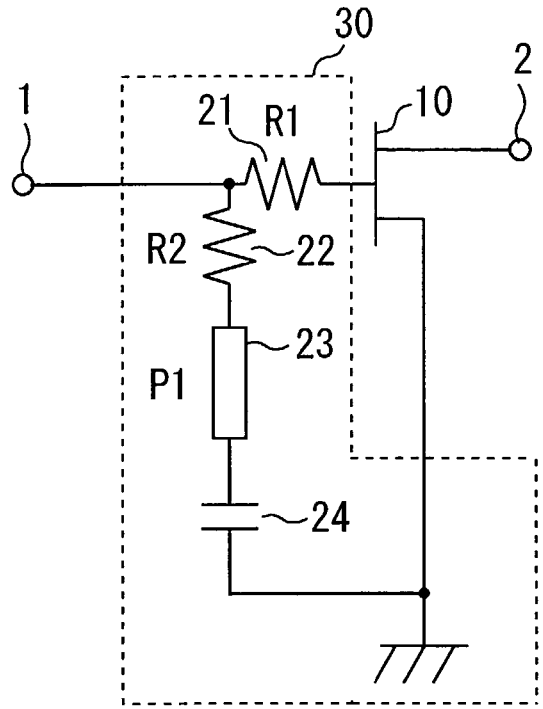
FIG. 3 is a circuit diagram of a radio-frequency power amplification circuit according to a second embodiment of the present invention.
Figure 4:
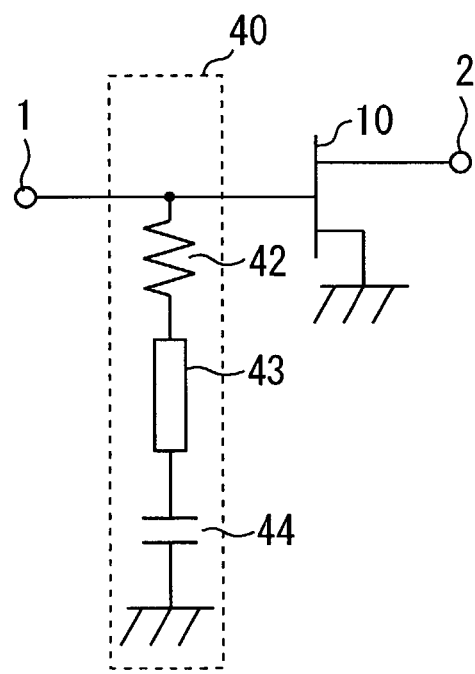
FIG. 4 is a circuit diagram of a conventional radio-frequency power amplification circuit.
Figure 5:
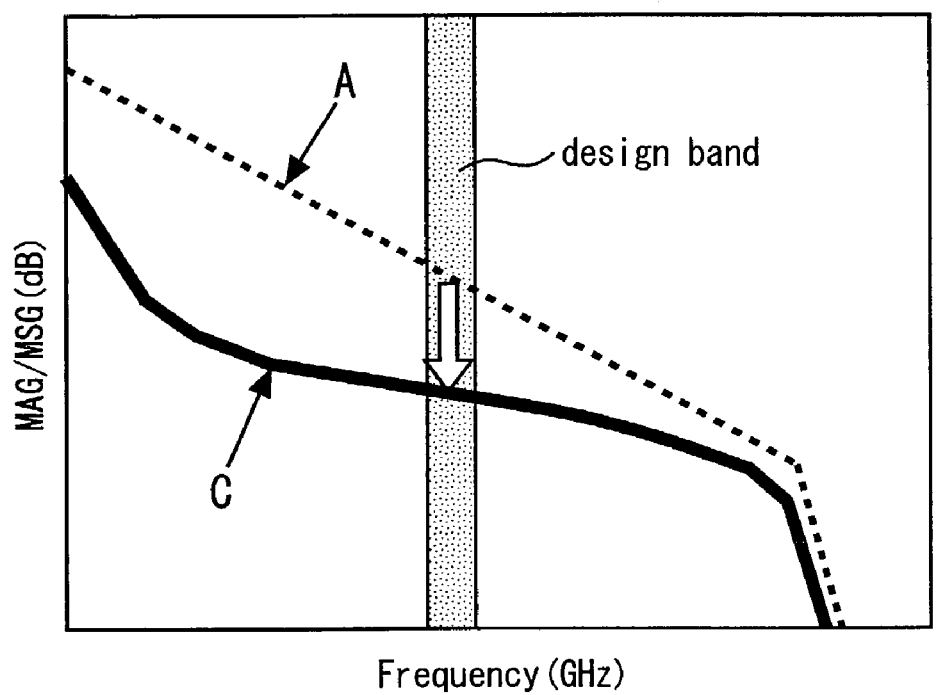
FIG. 5 is a graph showing frequency characteristics of the gain (MAG, MSG) of the conventional radio-frequency power amplification circuit of FIG. 4.

FIG. 3 is a circuit diagram of a radio-frequency power amplification circuit according to a second embodiment of the present invention.

The amplification circuit according to the second embodiment is approximately the same in circuit configuration as that according to the first embodiment. A difference between the amplification circuit according to the second embodiment and that according to the first embodiment will be described below.

The difference between the amplification circuit according to the second embodiment and that according to the first embodiment resides in a stabilization circuit 30. Specifically, in the stabilization circuit 30, the capacitance element 24 and the source terminal of the transistor 10 are connected to the common ground. In other words, the ground of the short stub 23 and that of the transistor 10 are made in common with each other.

The second embodiment provides the following advantages in addition to the advantages of the first embodiment. By making the ground of the short stub 23 in common with that of the transistor 10, the layout of the entire amplification circuit becomes compact, which leads to an advantage that the size of the entire circuit can be made small. Further, acquiring design parameters of a cell that is unified integrating the active element 10 and the stabilization circuit 30 can facilitate designing of an amplification circuit.

This invention, when practiced illustratively in the manner described above, provides the following major effects:

The present invention can provide a radio-frequency power amplification circuit that satisfies both of gain stabilization in a frequency range covering ranges above and below a design band and a high gain in the design band.

Further, the present invention is not limited to these embodiments, but variations and modifications may be made without departing from the scope of the present invention.

The entire disclosure of Japanese Patent Application No. 2002-231948 filed on Aug. 8, 2002 containing specification, claims, drawings and summary are incorporated herein by reference in its entirety.

What is claimed is:

1. A radio-frequency power amplification circuit comprising:

an active element; and a stabilization circuit provided upstream of said active element, wherein said stabilization circuit includes:
- a first resistance element, a first end of which is connected to said active element and a second end of which is connected to an input terminal;
- a second resistance element, a first end of which is connected to the second end of said first resistance element; and
- a short stub, a first end of which is connected to the second end of said second resistance element and a second end of which is grounded.

2. The radio-frequency power amplification circuit according to claim 1, wherein said active element is a transistor having a gate terminal connected to the first end of said first resistance element and a source terminal that is grounded, and the source terminal and said short stub are connected to a common ground.

3. The radio-frequency power amplification circuit according to claim 1, including a capacitance element wherein said short stub is grounded via said capacitance element.

* * * * *

UNITED STATES PATENT AND TRADEMARK OFFICE
CERTIFICATE OF CORRECTION

PATENT NO. : 6,982,603 B2
APPLICATION NO. : 10/338676
DATED : January 3, 2006
INVENTOR(S) : Shin Chaki It is certified that error appears in the above-identified patent and that said Letters Patent is hereby corrected as shown below:

Title Page item (73) Assignee: "'Renesas Technology Corp., Tokyo (JP)" should read --Mitsubishi Denki Kabushiki Kaisha, Tokyo (JP)--.

Signed and Sealed this

Third Day of August, 2010

David J. Kappos
*Director of the United States Patent and Trademark Office*